(12) United States Patent
Srinivasan et al.

(10) Patent No.: US 10,818,981 B2
(45) Date of Patent: Oct. 27, 2020

(54) BATTERY INTERNAL TEMPERATURE SENSING BATTERY MANAGEMENT SYSTEM

(71) Applicant: The Johns Hopkins University, Baltimore, MD (US)

(72) Inventors: Rengaswamy Srinivasan, Ellicott City, MD (US); Bliss G. Carkhuff, Laurel, MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 16/571,763

(22) Filed: Sep. 16, 2019

(65) Prior Publication Data

US 2020/0014082 A1 Jan. 9, 2020

Related U.S. Application Data

(62) Division of application No. 15/633,847, filed on Jun. 27, 2017, now Pat. No. 10,461,374.

(60) Provisional application No. 62/354,837, filed on Jun. 27, 2016.

(51) Int. Cl.
*H01M 10/42* (2006.01)
*H01M 10/0525* (2010.01)
*G01R 31/367* (2019.01)
*G01R 31/389* (2019.01)
*G01R 31/396* (2019.01)
*H01M 10/052* (2010.01)

(52) U.S. Cl.
CPC ...... *H01M 10/4257* (2013.01); *G01R 31/367* (2019.01); *G01R 31/389* (2019.01); *G01R 31/396* (2019.01); *H01M 10/0525* (2013.01); *H01M 10/425* (2013.01); *H01M 10/052* (2013.01); *H01M 2010/4271* (2013.01); *H01M 2010/4278* (2013.01)

(58) Field of Classification Search
CPC .......... H01M 10/425; H01M 10/4257; H01M 2010/4278; G01R 31/389; G01R 31/396
USPC ............................................................. 429/7
See application file for complete search history.

(56) References Cited

U.S. PATENT DOCUMENTS 6,324,042 B1 11/2001 Andrews
7,425,832 B2 9/2008 Gopal et al.

*Primary Examiner* — James M Erwin
(74) *Attorney, Agent, or Firm* — Noah J. Hayward

(57) ABSTRACT

A method is provided. The method is executable by a processor of a battery management system. The method includes sending a first command signal to a multiplexer to cause the multiplexer to select a cell of a battery. The method also includes sending a second command signal to a current source to apply a current to the cell of the battery. The method also includes receiving measurement information based on the application of the current to the cell from a measurement circuit.

8 Claims, 5 Drawing Sheets

BATTERY INTERNAL TEMPERATURE SENSING BATTERY MANAGEMENT SYSTEM

CROSS-REFERENCE TO RELATED APPLICATIONS

This application is a divisional of prior-filed, co-pending U.S. Nonprovisional application Ser. No. 15/633,847, filed Jun. 27, 2017, which claims priority to and the benefit of prior-filed U.S. Provisional Application No. 62/354,837, filed Jun. 27, 2016, the contents of each of which are herein incorporated by reference in their entireties.

BACKGROUND

In general, Lithium-ion (Li-ion) batteries are a preferred energy storage and power delivery system for a wide range of applications, including uninterrupted power supplies (UPS), electric vehicles (EV), airplanes, ships, computers, and smart phones. All such equipment and technologies demand efficient stored energy use, high power, fast recharge, and battery safety (e.g., avoiding cell venting, explosion, thermal runaway, and battery fire).

Conventional battery systems provide crude battery monitoring techniques to support efficient stored energy use, high power, fast recharge, and battery safety. Yet, conventional battery systems are limited in their support, while failing to provide diagnosis, forensic, and management capabilities that properly measure and maintain Li-ion batteries.

For instance, conventional battery systems can only monitor DC cell voltage, cell current, and surface temperature ($T_{surf}$, using thermocouples or thermistors), exclusively. Further, some conventional battery systems can measure AC impedance, but only at a single frequency, typically the amplitude of the impedance at 1 kHz, which provides information solely on the electrolyte resistance ($R_s$). Moreover, other conventional battery systems can monitor the battery voltage ($V_{bat}$), but not individual cell voltage. Since $T_{surf}$, $R_s$, and $V_{bat}$ do not provide useful information about battery safety or efficient utilization of the stored energy, monitoring of such parameters by conventional battery systems cannot fulfill battery safety demands.

SUMMARY

According to one or more embodiments, a method is provided. The method is executable by a processor of a battery management system. The method comprises sending, by the processor, a first command signal to a multiplexer to cause the multiplexer to select a cell of a battery; sending, by the processor, a second command signal to a current source to apply a current to the cell of the battery; and receiving, by the processor, measurement information based on the application of the current to the cell from a measurement circuit.

According to one or more embodiments or the method embodiment above, the method can comprise sending, by the processor, a third command signal to a second multiplexer to cause the second multiplexer to select a current path.

According to one or more embodiments or any of the method embodiments above, the first command signal and the third command signal can be synchronous commands.

According to one or more embodiments or any of the method embodiments above, the measurement information can comprise a cell voltage corresponding to the cell of the battery.

According to one or more embodiments or any of the method embodiments above, the measurement information can comprise a phase shift measurement corresponding to the cell of the battery.

According to one or more embodiments or any of the method embodiments above, the measurement information can comprise a cell impedance corresponding to the cell of the battery.

According to one or more embodiments or any of the method embodiments above, the measurement circuit can be electrically coupled to the processor and can comprise a gain circuit.

According to one or more embodiments or any of the method embodiments above, the measurement circuit can be electrically coupled to the processor and can comprise a root means square converter.

According to one or more embodiments, a battery management system is provided. The battery management system comprises a processor. The processor is configured to send a first command signal to a multiplexer to cause the multiplexer to select a cell of a battery; send a second command signal to a current source to apply a current to the cell of the battery; and receive measurement information based on the application of the current to the cell from a measurement circuit.

According to one or more embodiments or the battery management system embodiment above, the processor can be configured to send a third command signal to a second multiplexer to cause the second multiplexer to select a current path.

According to one or more embodiments or any of the battery management system embodiments above, the first command signal and the third command signal can be synchronous commands.

According to one or more embodiments or any of the battery management system embodiments above, the measurement information can comprise a cell voltage corresponding to the cell of the battery.

According to one or more embodiments or any of the battery management system embodiments above, the measurement information can comprise a phase shift measurement corresponding to the cell of the battery.

According to one or more embodiments or any of the battery management system embodiments above, the measurement information can comprise a cell impedance corresponding to the cell of the battery.

According to one or more embodiments or any of the battery management system embodiments above, the measurement circuit can be electrically coupled to the processor and can comprise a gain circuit.

According to one or more embodiments or any of the battery management system embodiments above, the measurement circuit can be electrically coupled to the processor and can comprise a root means square converter.

According to one or more embodiments, a system is provided. The system comprises a multiplexer configured to select a cell of a battery; a current source configured to apply a current to the cell of the battery; a measurement circuit configured to output measurement information based on the application of the current to the cell; and a microcontroller configured to control the operations of the multiplexer and current source via sending command signals.

According to one or more embodiments or the system embodiment above, the system can comprise a second multiplexer configured to select a current path from the current source to the cell of the battery.

According to one or more embodiments or any of the system embodiments above, the multiplexer and the second multiplexer can operate synchronously to select the cell of the battery and select the current path from the current source to the cell of the battery, respectively According to one or more embodiments or any of the system embodiments above, the measurement information can comprise one or more of a cell voltage corresponding to the cell of the battery, a phase shift measurement corresponding to the cell of the battery, a cell impedance corresponding to the cell of the battery.

BRIEF DESCRIPTION OF THE SEVERAL VIEWS OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

In view of the above, embodiments disclosed herein may include a battery internal temperature sensing battery management system, method, and/or computer program product (herein BITS-BMS). In general, the BITS-BMS is a safety centric sensor platform for batteries, such as lithium-ion batteries, with one or more cells. To employ the safety centric sensor platform, the BITS-BMS utilizes the safety standard and qualification that all cells of a battery should match to determine the 'whether and why' cells are mismatched. Mismatched cells are cells that diverge from each other due to aging, use, manufacturing, and/or abuse. Mismatched cells are first step to endangering the battery, equipment the battery powers, and an environment in which the equipment is located. The technical effects and benefits of the BITS-BMS include preventing dangerous situations that arise due to cells of the battery being mismatched at the time cells are selected to make a battery or at the times cells become mismatched due to aging, use, manufacturing, and/or abuse. Thus, embodiments herein are necessarily rooted in the BITS-BMS to perform proactive operations to overcome problems specifically arising in the realm of measuring and maintaining Li-ion batteries.

Figure 1:
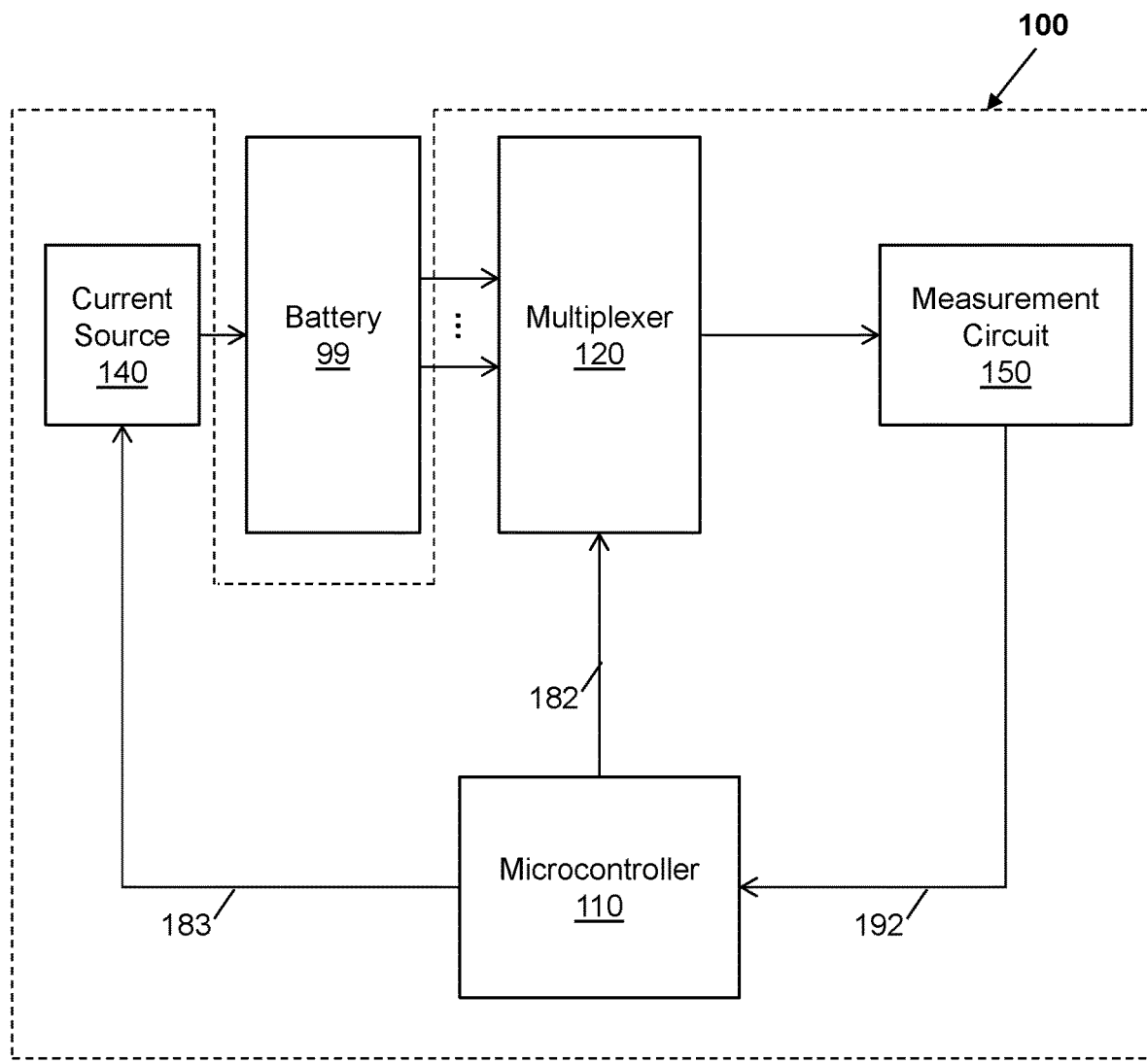
FIG. 1 depicts a schematic of a battery internal temperature sensing battery management system in accordance with one or more embodiments.

FIG. 1 depicts a schematic of a battery 99 being monitored and managed a BITS-BMS 100 in accordance with one or more embodiments. The BITS-BMS 100 comprises a microcontroller 110, a multiplexer 120, a current source 140, and a measurement circuit 150. Further, in the BITS-BMS 100, the microcontroller 110 can communicate command signals 182 and 183 and receive measurement information 192.

In general, the microcontroller 110 can be a single integrated circuit comprising one or more processor cores, a memory, and programmable input/output peripherals. The multiplexer 120 can be a device that selects one of several input signals and forwards the selected input into a single line. The battery 99 can be a device comprising one or more electrochemical cells with external connections provided to power electrical devices. The current source 140 can be an electronic circuit that delivers an electric current, such as an alternating current (AC) or a direct current (DC) (e.g., AC current can be used to excite the battery 99 to procure measurement information for testing/diagnosis and 2) DC current can be used for charging). The measurement circuit 150 can include a set of measuring instruments, such as a gain circuit, a root means squared converter, etc., which perform measurements on the battery to obtain measurement information and feed the measurement information to the microcontroller 110. The measurement information can comprise cell voltage measurements, phase-shift measurement, impedance measurements, etc.

The speed and the multi-frequency AC impedance capabilities distinguish the BITS-BMS 100 from conventional battery systems. The BITS-BMS 100 is a multi-frequency AC impedance-based battery management system (BMS). The BITS-BMS 100 utilizes the measurement circuit 150 to measure simultaneously amplitude and phase (real and imaginary components) of the impedance in a frequency range (e.g., up to 1000 Hz). The BITS-BMS 100 utilizes the measurement circuit 150 can also measure a DC cell voltage. Through the measurements of AC impedance and DC voltage, the BITS-BMS 100 can monitor every cell in a battery in near real time (within seconds). For every cell in the battery, The BITS-BMS 100 can also utilize the measurement circuit 150 to measures the cell's internal temperature, internal impedance, cell voltage, state of charge (SOC) and state of health (SOH), while the battery is at rest or when the battery is under charge/discharge.

The BITS-BMS 100 utilizes the microcontroller 110 to leverage measured parameters (e.g., internal temperature, impedance, and cell voltage), to the send commands 182 and 183, along with other commands to control devices, such as switches and relays, to adjust the amplitude of the current to charge and discharge the battery safely and rapidly. Note that a reporting time per cell is adjustable. For example, the reporting time can be set to a fraction of a second to report only on cell voltage and electrolyte resistance, to less than two seconds to include anode temperature, and up to 12 seconds to include cathode temperature. The BITS-BMS 100 can include a small footprint (e.g., 4-inch×4-inch footprint), utilizes low-power (e.g., requiring 6-V, 750 mA DC power to operate), and can act as a "standalone" unit with no need for an external processor or computer.

Figure 2:
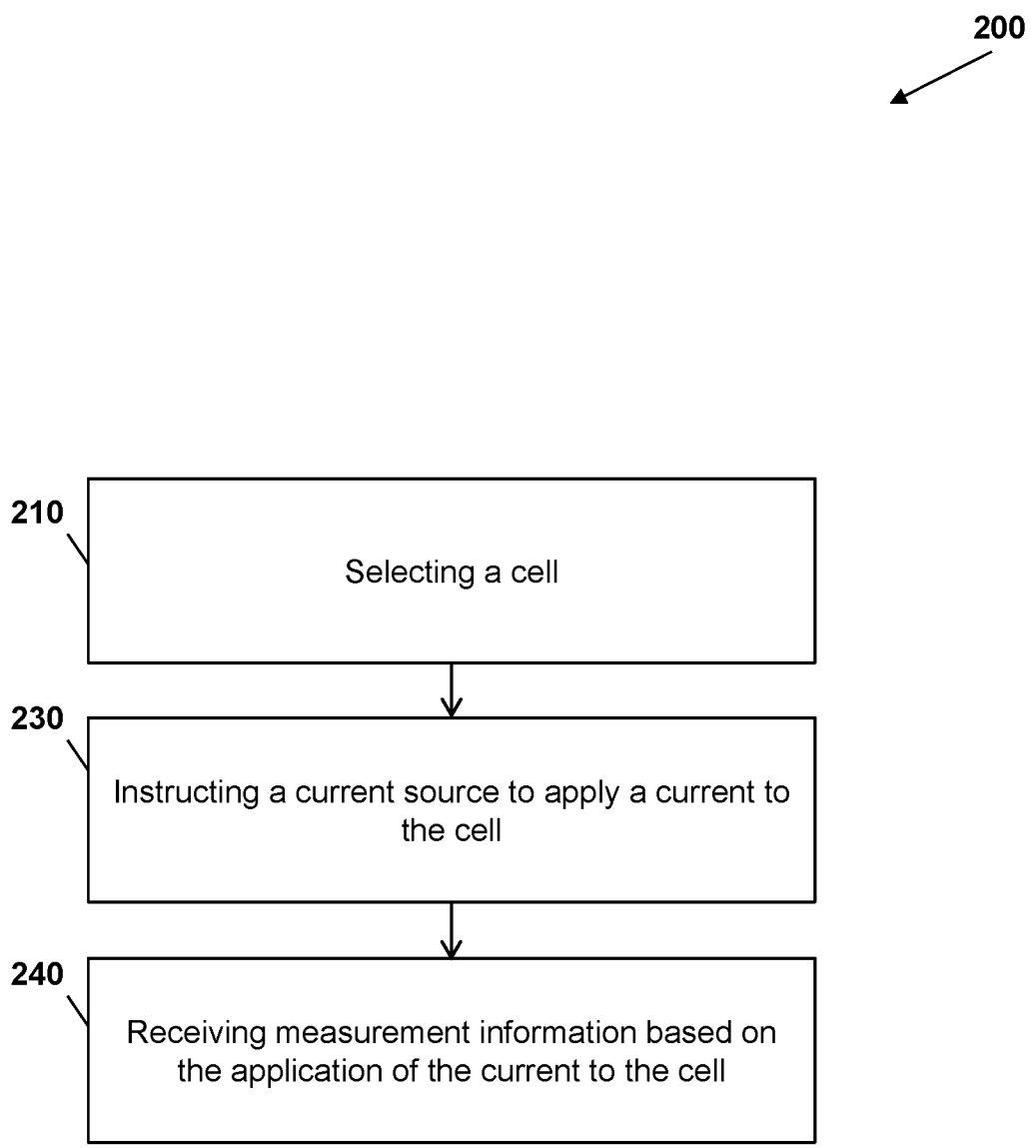
FIG. 2 depicts a process flow of battery internal temperature sensing battery management system in accordance with one or more embodiments.

Turning to FIG. 2 with reference to FIG. 1, an operation of the BITS-BMS 100 is depicted by a process flow 200 in accordance with one or more embodiments. The process flow 200 begins at block 210, where the microcontroller 110 sends the command signals 182 to the multiplexer 120 to select a cell of the battery 99.

At block 230, the microcontroller 110 sends the command signals 183 to the current source 140 to apply a current to the cell of the battery 99. The microcontroller 110 sends the command signals 183 to the current source 140 to tell the current source 140 to inject a current through all the cells that are connected in series. Since the microcontroller 110 utilizes the multiplexer 120 connect a given at a given time to the measurement circuit 150, only one cell is measured at a time by the measurement circuit 150. Note that the microcontroller 110 can make decisions based on the measurement information that it is fed from the measurement circuit 150. For example, if a cell internal temperature or cell voltage is too high for a particular cell, then that cell should not receive any current. In turn, the microcontroller 110 can send a command to a charger to not send any current through the battery 99.

As the current travels through the cell of the battery, the measurement circuit 150 performs measurements of the battery to obtain measurement information and feeds that measurement information to the microcontroller 110. At block 240, the microcontroller 110 receives the measurement information based on the application of the current to the cell. Note that, with respect to FIGS. 1 and 2, the microcontroller 110 is controlling an AC current source by sending command signals 182 and 183 that tell the other components what cell to measure to determine whether the cells of the battery 99 are mismatched.

Figure 3:
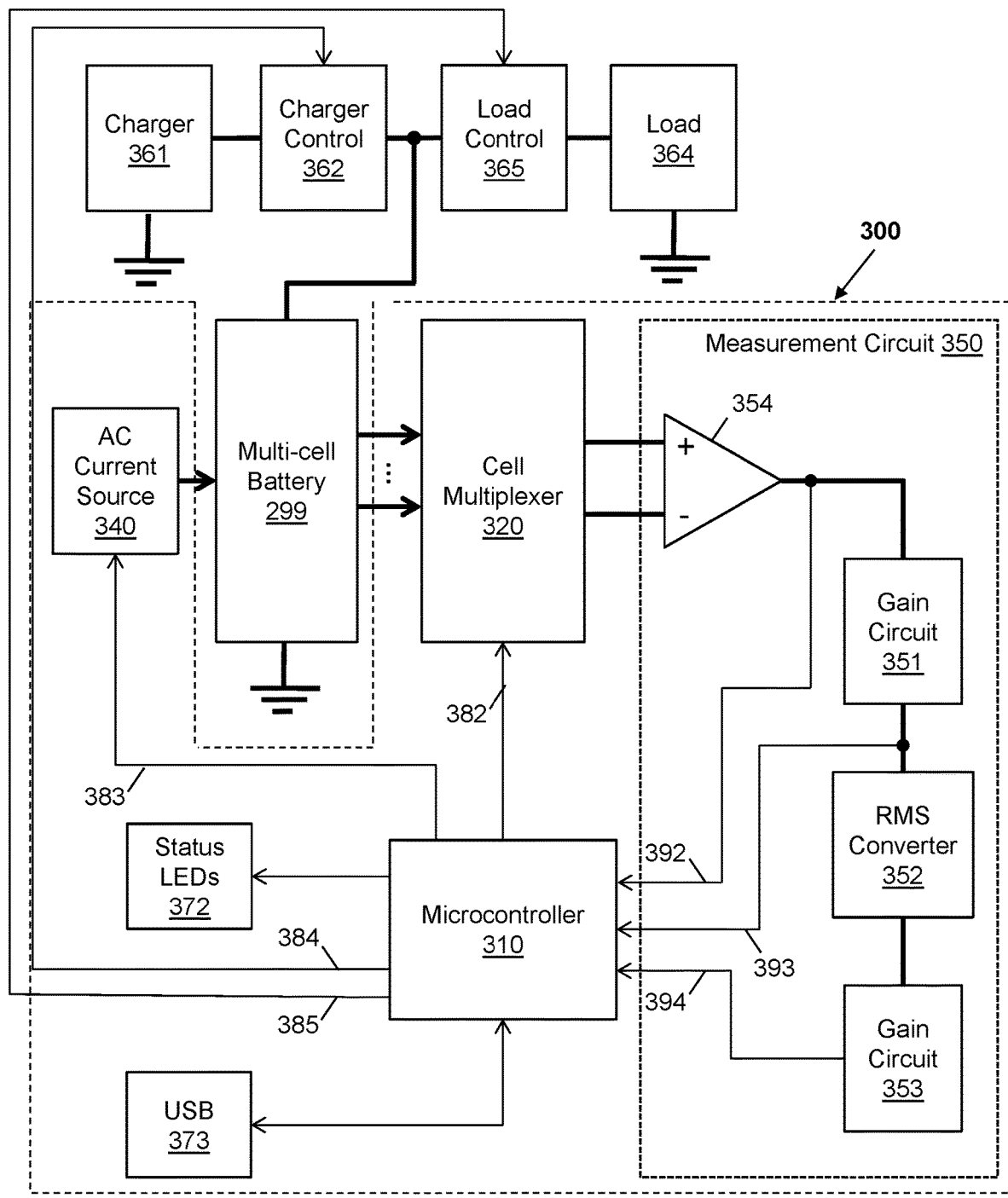
FIG. 3 depicts a schematic of a battery internal temperature sensing battery management system in accordance with one or more embodiments.

FIG. 3 depicts a schematic of a multi-cell battery 299 being monitored and managed by a BITS-BMS 300 in accordance with one or more embodiments. The BITS-BMS 300 comprises a microcontroller 310, a cell multiplexer 320, an AC current source 340. Further, the BITS-BMS 300 comprises a measurement circuit 350 comprising a gain circuit 351, a root means square converter 352, and a gain circuit 353, along with a buffer 352. The BITS-BMS 300 can be connected to a charger 361, a charger control 362, a load 364, and a load control 365. The BITS-BMS 300 can comprise status light emitting diodes (LEDs) 372 and a universal serial bus (USB) 373. In the BITS-BMS 300, the microcontroller 110 can communicate command signals 382, 383, 384, and 385 and can receive measurement information 392, 393, and 394, while the charger 361, the load 364, and the multi-cell battery can be connected to ground. Note that, for ease of explanation, elements of the BITS-BMS 300 of FIG. 3 that are similar to the BITS-BMS 100 of FIG. 1 are not reintroduced.

The gain circuits 351 and 353 increase the amplitude of a signal received from the cell multiplexer 320. The root means square converter 352 converts the signal received from the cell multiplexer 320 (i.e., an alternating current signal) into a direct current signal of equivalent value.

According to one or more embodiments, the multi-cell battery 299 can be a 16 cell battery, where the 16 cells are connected in series. The AC current sources can provide an AC current to the multi-cell battery 299 based on the command signals 382 from the microcontroller 310. The charger 361 can provide a direct current to the multi-cell battery 299 to charge one or more of the 16 cells based on the operations of the charger control 363, which is responding to the command signals 384 from the microcontroller 310. The load can withdraw a direct current from the multi-cell battery 299 to utilize power within the one or more of the 16 cells based on the operations of the load control 365, which is responding to the command signals 385 from the microcontroller 310. The buffer 354 (also referred to as a buffer amplifier) can provide an electrical impedance transformation from the multi-cell battery 299 to the remaining portions of the measuring circuit. The status LEDs 372 can provide a visual indication of the operations of the BITS-BMS 300, such as power on, power off, measuring, selecting, charging, etc. The USB 373 can provide a communication mechanism for external systems (such as a laptop) to the microcontroller 310, for example, to enable viewing of the measurement information and/or programming of the microcontroller 310. The BITS-BMS 300 functionalities are limited by the number of cells in the battery. In other words, the number of cells in the battery can far exceed the 16-cell example discussed above, and the BITS-BMS functionalities are equally applicable to that larger/bigger battery.

In accordance with one or more embodiments, the measurement circuit 350 of the BITS-BMS 300 can measure both amplitude and phase shift of the AC impedance at multiple frequencies. In turn, the measurement circuit 350 can characterize each individual cell including the states of the anode, the cathode and, the electrolyte. By coupling the measuring both amplitude and phase shift of the AC impedance at multiple frequencies with the BITS-BMS 300 capability of measuring the DC cell voltage, the BITS-BMS 300 achieves effective battery safety and energy management that conventional battery systems cannot achieve.

For example, the BITS-BMS 300 monitors multiple parameters in every cell in the multi-cell battery 299. These parameters can include cell voltage ($E_{cv}$), anode temperature ($T_a$), cathode temperature ($T_c$), $R_s$, SOH, and SOC. $T_a$, $T_c$, $R_s$, SOH and SOC are monitored using ac impedance. For monitoring $E_{cv}$, the BITS-BMS 300 can include a built-in DC voltmeter that has an input impedance of 2 MΩ. $E_{cv}$, $T_a$, $T_c$, $R_s$ and SOH are monitored while the multi-cell battery 299 is under charge, discharge or when it is at rest. SOC is monitored only when the multi-cell battery 299 is at rest. To monitor SOC when the multi-cell battery 299 is under charge or discharge, the BITS-BMS 300 can be augmented with a COTS DC current meter or a coulometer. The BITS-BMS 300 can include built-in circuits to prevent short-circuiting the wirings in any cell and/or the multi-cell battery 299. Note that the battery voltage and current cannot influence operations of BITS-BMS 300. Note also that the AC and DC measurement capabilities of the BITS-BMS 300 provide lithium battery thermal safety and electrical efficiency factors, such as diagnostics abilities, forensics abilities, and power-energy-thermal management.

Diagnostics by the BITS-BMS 300 relate to scenarios where a user desires to diagnose and group cells into matching sets. For instance, diagnostics by the BITS-BMS 300 can comprise screening and matching cells before use in assembling a battery and detecting the mismatched cells after the battery is assembled. Examples of diagnostics can include end-of-line diagnostic and screening for cell matching.

Forensics by the BITS-BMS 300 relate to scenarios where the multi-cell battery 299 was in some kind of incident and safety needs to be determined. For instance, if the battery is being used in a vehicle and the vehicle is in an accident, the BITS-BMS 300 can provide a forensic analysis to determine with cells are damaged. For instance, because forensic diagnostics of Li-ion cells in a damaged battery is inherently unsafe and to prevent damage to the multi-cell battery 299 by the BITS-BMS 300, the BITS-BMS 300 can prevent forced charging or discharging the cells in the multi-cell battery 299 and can prevent the multi-cell battery 299 from forcing a current through the measurement circuit 350 and the load 365. Also, as a forensic tool, the BITS-BMS 300 can conduct diagnostics by evaluating the cells without perturbing the cells and then perturbing the cells with ultra-small AC current signal. The BITS-BMS 300 can also identify burned-out cells in a battery.

Power, energy and thermal management by the BITS-BMS 300 relate to scenarios where use of the multi-cell battery 299. While conventional battery systems can provide primitive form of battery management, the power, energy and thermal management by the BITS-BMS 300 is distinguished from the conventional battery systems as the BITS-BMS 300 conducts impedance measurements.

Note that a Li-ion battery (and an example of the multi-cell battery 299) is a device that stores and releases energy, repeatedly up to thousands of times before losing its reliability. Li-ion batteries contain one or more lithium-ion cells (e.g., 16 cells). In operation, Li-ion batteries store chemical energy in individual cells, and release it on demand, not as chemical energy, but mostly as electrical energy and much less as heat energy. The amount of heat energy released depends upon the environmental temperature; more heat is released when the Li-ion battery is discharged at lower operating temperatures. No matter what the environmental temperature is, all cells in the Li-ion battery are expected to work in concert, each cell releasing the same amount of electrical energy and heat energy as its neighbor. The one-cell and multi-cell lithium-ion batteries also share a common problem. Occasionally, one or more cells in the Li-ion battery may release more heat than electrical energy, causing the cell(s) to vent, explode, catch on fire, and propagate the problem to the neighboring cells. To prevent these problems, the power, energy and thermal properties of every cell in the Li-ion battery is carefully managed by the BITS-BMS 300. That is, the BITS-BMS 300 can monitor the form of energy (electrical and heat), and the rate of energy release, control the rate of energy delivery during discharge and the rate of energy intake during charge, and report and raise an alarm when the rate of release or intake exceed the preset limit.

Figure 4:
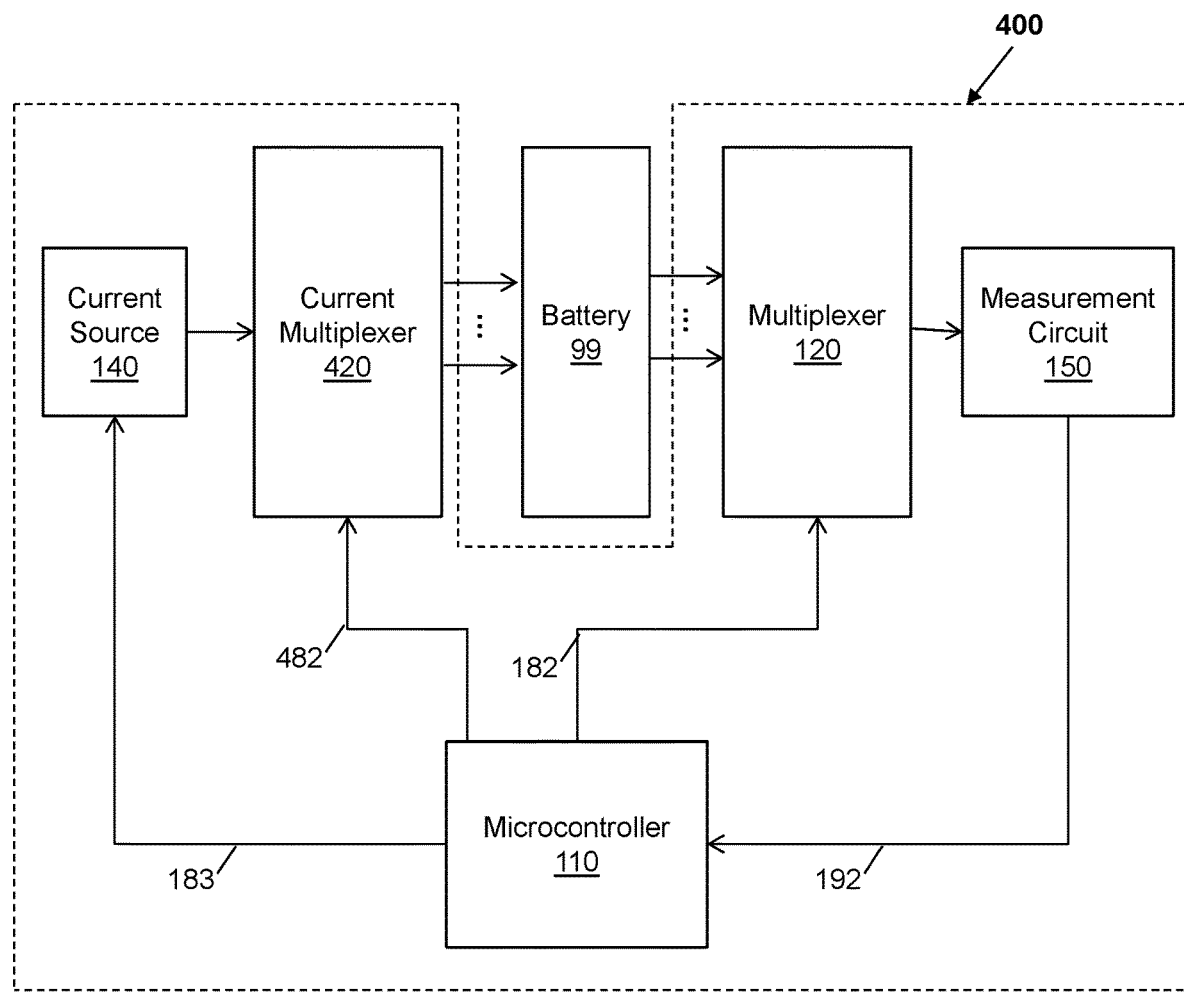
FIG. 4 depicts a process flow of battery internal temperature sensing battery management system in accordance with one or more embodiments.

FIG. 4 depicts a schematic of a BITS-BMS 400 in accordance with one or more embodiments. Note that, for ease of explanation, elements of the BITS-BMS 400 of FIG. 4 that are similar to the BITS-BMS 100 of FIG. 1 and BITS-BMS 300 of FIG. 3 are not reintroduced. The BITS-BMS 400 comprises a current multiplexer 420 that operates with respect to command signals 482 received from the microcontroller 110.

Figure 5:
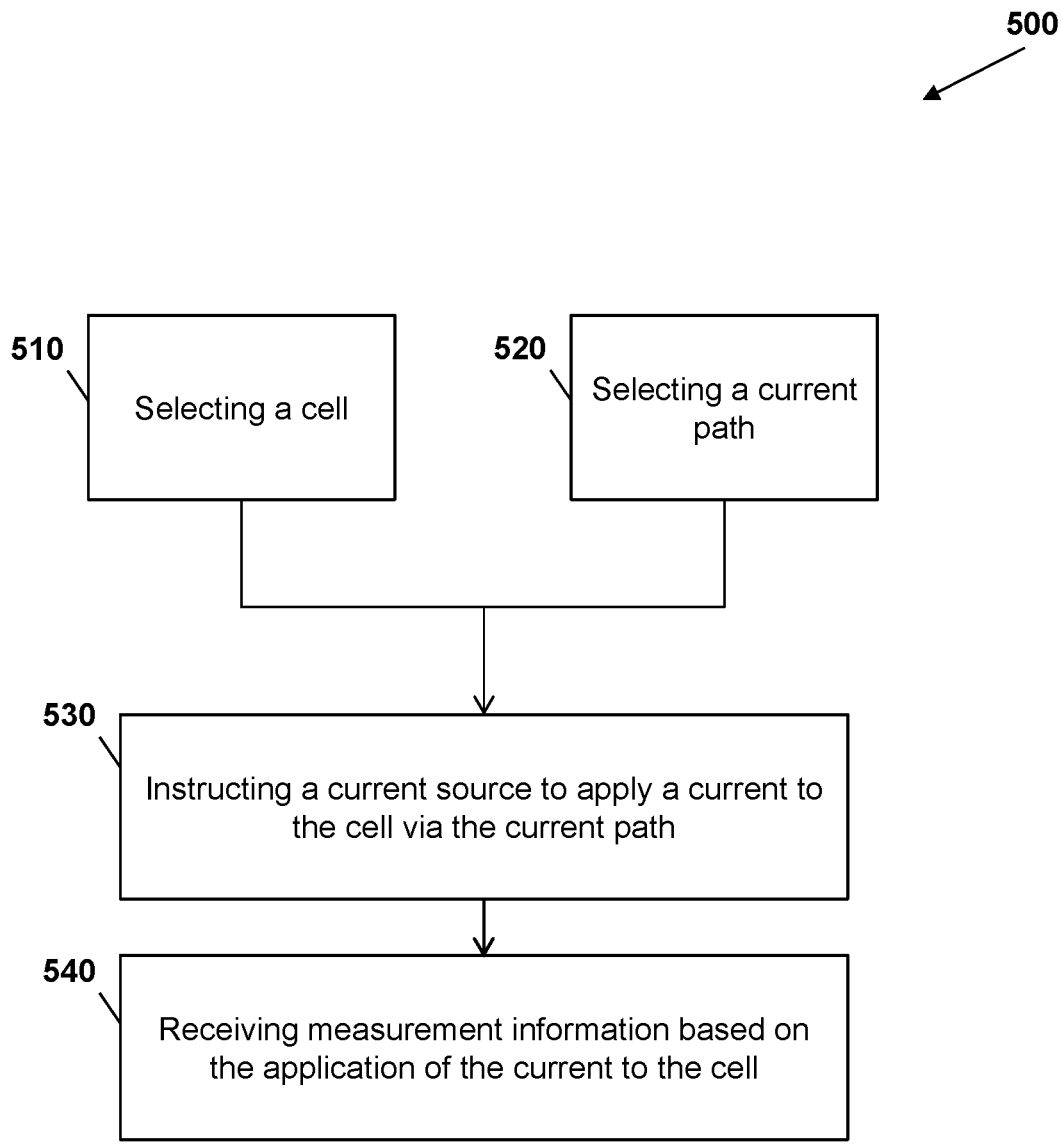
FIG. 5 depicts a process flow of battery internal temperature sensing battery management system in accordance with one or more embodiments.

Turning to FIG. 5 with reference to FIG. 4, an operation of the BITS-BMS 400 is depicted by a process flow 500 in accordance with one or more embodiments. The process flow 500 begins at blocks 510 and 520, which can operate simultaneously. That is, the microcontroller 110 can send the command signals 182 and 482 to the multiplexer 120 and the current multiplexer 420 to respectively select a cell of the battery 99 and to select a current path from current source 140 and the battery 99. Thus, the multiplexer 120 and the current multiplexer 420 perform a synchronous operation. At block 530, the microcontroller 110 sends the command signals 183 to the current source 140 to apply a current to the cell of the battery 99 in accordance select path by the current multiplexer. At block 540, the microcontroller 110 receives the measurement information based on the application of the current to the cell.

Example embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method executable by a processor of a battery management system, the method comprising:
    sending, by the processor, a first command signal to a multiplexer to cause the multiplexer to select a cell of a battery;
    sending, by the processor, a second command signal to a current source to apply a current to the cell of the battery; and
    receiving, by the processor, measurement information based on the application of the current to the cell from a measurement circuit,
    wherein the measurement information comprises a cell voltage.

2. The method of claim 1, the method comprising:
    sending, by the processor, a third command signal to a second multiplexer to cause the second multiplexer to select a current path.

3. The method of claim 2, wherein the first command signal and the third command signal are synchronous commands.

4. The method of claim 1, wherein the cell voltage is a single cell voltage corresponding to the cell of the battery.

5. The method of claim 1, wherein the measurement information comprises a phase shift measurement corresponding to the cell of the battery.

6. The method of claim 1, wherein the measurement information comprises a cell impedance corresponding to the cell of the battery.

7. The method of claim 1, wherein the measurement circuit is electrically coupled to the processor and comprises a gain circuit.

8. The method of claim 7, wherein the measurement circuit is electrically coupled to the processor and comprises a root means square converter.

* * * * *